(12) United States Patent  
Okada et al.

(10) Patent No.: US 9,257,316 B2  
(45) Date of Patent: Feb. 9, 2016

(54) SEMICONDUCTOR TESTING JIG AND TRANSFER JIG FOR THE SAME

(71) Applicant: Mitsubishi Electric Corporation, Tokyo (JP)

(72) Inventors: Akira Okada, Tokyo (JP); Takaya Noguchi, Tokyo (JP); Norihiro Takesako, Tokyo (JP); Kinya Yamashita, Tokyo (JP); Hajime Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 92 days.

(21) Appl. No.: 14/317,397

(22) Filed: Jun. 27, 2014

(65) Prior Publication Data

US 2015/0091599 A1    Apr. 2, 2015

(30) Foreign Application Priority Data

Oct. 2, 2013   (JP) ................................. 2013-207130

(51) Int. Cl.
| | |
|---|---|
| *G01R 31/00* | (2006.01) |
| *G01R 31/26* | (2014.01) |
| *H01L 21/67* | (2006.01) |
| *G01R 1/04* | (2006.01) |

(52) U.S. Cl.
CPC ........ *H01L 21/67265* (2013.01); *G01R 1/0408* (2013.01)

(58) Field of Classification Search
CPC ............... G01R 1/0416; G01R 1/0466; G01R 1/07378; G01R 15/207; G01R 1/06722; G01R 1/06733; G01R 1/07314; G01R 1/0735; G01R 31/2853; G01R 31/2889; H01R 12/714; H01R 12/88; H01R 13/24; H01R 43/0256; H01L 27/124; H01L 2224/13005; H01L 23/3107; H01L 23/3114; H01L 23/3121; H01L 23/3157; H01L 23/525; H01L 24/06; H01L 27/156; H01L 27/3248; H01L 2924/01074

See application file for complete search history.

(56) References Cited

U.S. PATENT DOCUMENTS

| | | | | |
|---|---|---|---|---|
| 5,936,418 | A * | 8/1999 | Ideta ..................... | H05K 7/1023 324/756.02 |
| 7,514,946 | B2 | 4/2009 | Soeta et al. | |
| 7,521,757 | B2 | 4/2009 | Kobayashi et al. | |
| 2004/0046581 | A1* | 3/2004 | Maekawa ............. | G01R 1/0483 324/754.03 |
| 2009/0015279 | A1* | 1/2009 | Cho ..................... | G01R 1/0483 324/756.02 |
| 2013/0260592 | A1* | 10/2013 | Lee ........................ | H01R 23/70 439/330 |

FOREIGN PATENT DOCUMENTS

| | | |
|---|---|---|
| JP | 2006-292727 A | 10/2006 |
| JP | 2008-004739 A | 1/2008 |
| JP | 2008-141135 A | 6/2008 |

* cited by examiner

*Primary Examiner* — Vinh Nguyen  
(74) *Attorney, Agent, or Firm* — Studebaker & Brackett PC (57) ABSTRACT

A semiconductor testing jig is provided with a conductive stage including a plurality of mounting portions on which a plurality of vertical semiconductor devices are each individually disposed with lower surface electrodes being in contact with the plurality of mounting portions, an insulating frame portion having a lattice pattern that is disposed on the stage and surrounds each of the plurality of mounting portions in plan view to define each of the mounting portions, and an abrasive layer disposed in a position in the frame portion, the position facing each of the vertical semiconductor devices disposed on the mounting portions.

19 Claims, 4 Drawing Sheets

SEMICONDUCTOR TESTING JIG AND TRANSFER JIG FOR THE SAME

BACKGROUND OF THE INVENTION

1. Field of the Invention

The present invention relates to a semiconductor testing jig that holds a plurality of vertical semiconductor devices each having a lower surface electrode and an upper surface electrode in a state of being in contact with a mounting surface and to a transfer jig for the semiconductor testing jig.

2. Description of the Background Art

When a test on electrical properties of individual semiconductor devices formed into chips is carried out, it is common to carry out the test on the electrical properties individually by bringing a measuring electrode into contact with the semiconductor devices after positioning the semiconductor devices individually. Thus, workability is poor, and the number of testing processes tends to increase.

To solve the problems, a semiconductor transfer tray capable of collectively handling a plurality of semiconductor devices such as IC packages and an inspection apparatus for testing have been developed (for example, see Japanese Patent Application Laid-Open No. 2006-292727).

In a semiconductor device having a vertical structure that passes a current in a vertical direction, namely, an out-of-plane direction of the semiconductor device (hereinafter, referred to as a "vertical semiconductor device"), a stage on the inspection apparatus for testing side fixing a mounting surface of the vertical semiconductor device is one of the measuring electrodes. Consequently, adhesion of the stage to the semiconductor device affects a contact resistance, thereby affecting the electrical properties of the semiconductor device.

If there is a foreign matter such as a dust on the stage, the vertical semiconductor device is disposed on the foreign matter, and when the measuring electrode comes in contact with the vertical semiconductor device, the mounting surface of the vertical semiconductor device is pressed hard against the foreign matter. If the foreign matter is large, a defect such as a crack is generated in a contact portion of the vertical semiconductor device with the stage and in a portion near the contact portion, resulting in a breakage in a part of the vertical semiconductor device. The broken vertical semiconductor device is counted as a defective product.

On the other hand, if the foreign matter is not large enough to be visually checked and if the foreign matter is relatively small in the size of, for example, several tens of μm or less, pressure applied to bring the measuring electrode into contact with the vertical semiconductor device leads to distortion of the vertical semiconductor device. Thus, leakage of current due to piezo electric effect increases, and thus the vertical semiconductor device is counted as a defective product.

As a measure against an increase in a defective rate of the vertical semiconductor device due to the foreign matter on the stage, the method for adding a stress buffer film to a back side of a semiconductor substrate to reduce the stress due to the foreign matter has been developed (for example, see Japanese Patent Application Laid-Open No. 2008-4739).

It is known that when a semiconductor wafer is formed into small pieces, many small flakes or chippings of a semiconductor wafer material are generated from a side surface of the semiconductor device and become foreign matters adhering to the side surface and close to the side surface, which are subsequently brought into a testing process. The adhesion of the foreign matters may also cause an electro static charge generated during the process. In addition, it is known that a metal caught during the manufacturing process causes to generate a foreign matter. Moreover, it is known that a fragment generated by dice-cutting becomes a foreign matter when the fragment connected to a metal electrode film is brought into a next process.

As a measure against a foreign matter which is a fragment generated by dice-cutting and connected to the metal electrode film, the method for removing the metal electrode film on a scribe line has been developed (for example, see Japanese Patent Application Laid-Open No. 2008-141135).

However, the semiconductor transfer tray and the inspection apparatus for testing disclosed in Japanese Patent Application Laid-Open No. 2006-292727 have complex structures and cannot be compatible with the vertical semiconductor device. Moreover, the semiconductor transfer tray and the inspection apparatus for testing are not subjected to the measure against a foreign matter.

In the semiconductor device disclosed in Japanese Patent Application Laid-Open No. 2008-4739, a film that reduces stress due to a foreign matter put on semiconductor substrates is added to all the semiconductor substrates for measuring electrical properties, to thereby achieve a reduction in a defective rate. However, the film needs to be added to all the semiconductor substrates, and thus the number of processes for manufacturing the semiconductor device increases. Moreover, the addition of the film increases manufacturing costs of the semiconductor device.

In the semiconductor device disclosed in Japanese Patent Application Laid-Open No. 2008-141135, removing the metal electrode film from the scribe line suppresses the generation of the foreign matter. However, the metal electrode film needs to be removed from every semiconductor wafer, and thus the number of processes for manufacturing the semiconductor device increases. Moreover, upon removal of the metal electrode film, an adhesive tape is attached to every semiconductor wafer and then peeled off again, so that the addition of the adhesive tape increases manufacturing costs of the semiconductor device.

SUMMARY OF THE INVENTION

It is an object of the present invention to provide a technique capable of simplifying a manufacturing process of a vertical semiconductor device and reducing manufacturing costs while a foreign matter is suppressed to adhere to a mounting surface of a vertical semiconductor device during a test.

A semiconductor testing jig according to the present invention is a jig for testing a plurality of vertical semiconductor devices each having a lower surface electrode and an upper surface electrode. The semiconductor testing jig is provided with a conductive stage including a plurality of mounting portions on which the plurality of vertical semiconductor devices are each individually disposed with the lower surface electrodes being in contact with the plurality of mounting portions, an insulating frame portion having a lattice pattern that is disposed on the stage and surrounds each of the plurality of mounting portions in plan view to define each of the mounting portions, and an abrasive layer disposed in a position in the frame portion, the position facing each of the vertical semiconductor devices disposed on the mounting portions.

A transfer jig for a semiconductor testing jig according to the present invention for transferring the semiconductor testing jig is provided with a vibration mechanism that is disposed in a portion near a contact portion with the semiconductor testing jig and applies vibration to the vertical semiconductor devices.

A semiconductor testing jig includes an abrasive layer disposed, on a frame portion, in a position facing each of vertical semiconductor devices disposed on mounting portions, so that when the vertical semiconductor devices are disposed on the mounting portions of the semiconductor testing jig, a contact of the vertical semiconductor devices with the abrasive layer removes a foreign matter adhering to the vertical semiconductor devices. Thus, during a test, the foreign matter can be suppressed to adhere to lower surface electrodes being mounting surfaces of the vertical semiconductor devices. Furthermore, upon the test of the vertical semiconductor devices, each of the vertical semiconductor devices is disposed on the mounting portions of the semiconductor testing jig, so that disposing the abrasive layer on the semiconductor testing jig eliminates the need for each of the vertical semiconductor devices to take measures against the foreign matter. Thus, a manufacturing process of the vertical semiconductor devices can be simplified and manufacturing costs can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
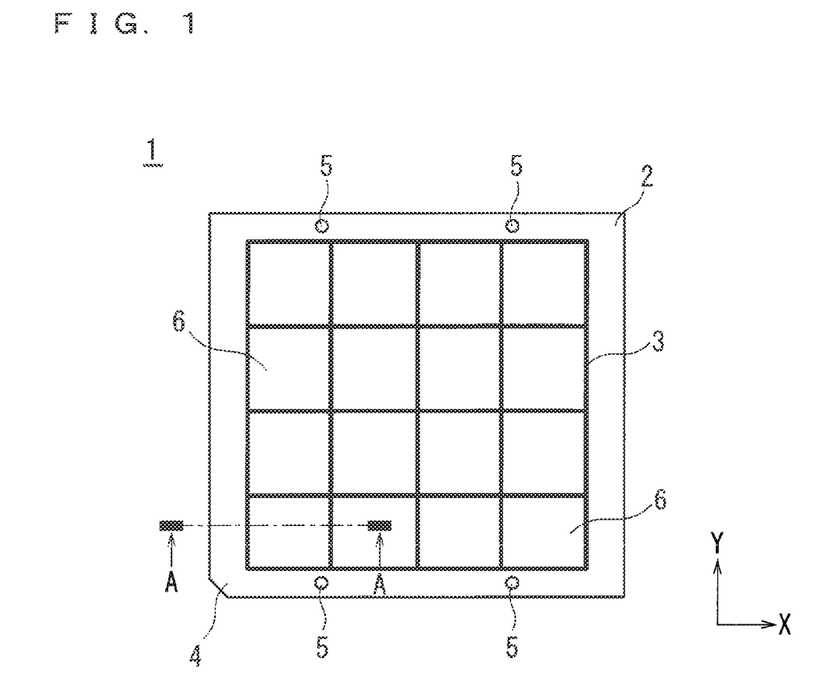
FIG. 1 is a plan view of a semiconductor testing jig according to a first preferred embodiment.
Figure 2:
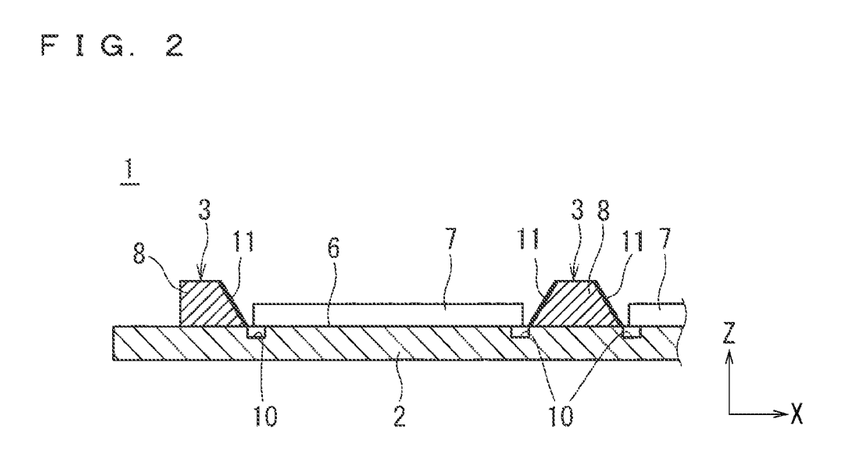
FIG. 2 is a cross sectional view of the semiconductor testing jig according to the first preferred embodiment.

A first preferred embodiment of the present invention will be described below with reference to the drawings. FIG. 1 is a plan view of a semiconductor testing jig 1 according to the first preferred embodiment. FIG. 2 is a cross sectional view of the semiconductor testing jig 1, more specifically, a cross sectional view taken along an A-A line in FIG. 1. FIG. 2 shows the semiconductor testing jig 1 as well as vertical semiconductor devices 7 disposed on the semiconductor testing jig 1, and FIG. 1 shows only the semiconductor testing jig 1 for the sake of simplification. A horizontal direction and a vertical direction towards the plane of FIG. 1 will be described as X direction and Y direction, respectively. A vertical direction towards the plane of FIG. 2 will be described as Z direction. The following drawings will be described with reference to the directions of arrows shown in FIGS. 1 and 2.

As shown in FIGS. 1 and 2, the semiconductor testing jig 1 is a jig for testing a plurality of vertical semiconductor devices 7, and the semiconductor testing jig 1 includes a stage 2, a frame portion 3, an abrasive layer 11, and groove portions 10. The stage 2 is formed of metal possessing electrical conductivity (for example, aluminum plate) on the assumption of evaluation of a semiconductor device having the vertical structure. A plurality (for example, sixteen) of mounting portions 6 on which the plurality (for example, sixteen) of vertical semiconductor devices 7 are each individually disposed are disposed on an upper surface (surface in Z direction) of the stage 2.

The mounting portions 6 preferably secure a flat surface on which a burr and a protrusion are not formed, so that the mounting portions 6 do not damage the mounting surfaces of the vertical semiconductor devices 7. The flat surfaces of the mounting portions 6 are formed after a cleaning process and an abrasive process.

The vertical semiconductor devices 7 in which a current is passed vertically each have a lower surface electrode and an upper surface electrode. The vertical semiconductor devices 7 are mounted with the lower surface electrodes thereof being in contact with the mounting portions 6 of the stage 2.

The frame portion 3 is made of an insulating material (such as a resin of PPS or the like) to prevent continuity among the individual vertical semiconductor devices 7. The frame portion 3 is disposed on the upper surface of the stage 2 and formed in a lattice pattern that surrounds each of the plurality of mounting portions 6 in plan view to define the mounting portions 6. The structure in which the sixteen vertical semiconductor devices 7 are mounted in the one semiconductor testing jig 1 is shown, but it is not restrictive. The number of the vertical semiconductor devices 7 being mounted may increase or decrease correspondingly to the size of the semiconductor testing jig 1 and the size of the vertical semiconductor devices 7.

The frame portion 3 includes a projection portion 8 protruding upward from the upper surface of the stage 2. Moreover, the projection portion 8 is formed in a trapezoid in a cross sectional view. As to the shape of the projection portion 8 in detail, a side surface of the projection portion 8 facing a side surface of each of the vertical semiconductor devices 7 mounted on the upper surfaces of the mounting portions 6 (namely, a surface on an inner portion side of the frame portion 3 having the lattice pattern) is formed to be an inclined surface to the upper surfaces of the mounting portions 6. On the other hand, a side surface on an outer portion side of the frame portion 3 is formed to be a vertical surface to the upper surfaces of the mounting portions 6.

The abrasive layer 11 is a layer that enhances frictional force to accelerate removal of a foreign matter adhering to the vertical semiconductor devices 7. The abrasive layer 11 is disposed on the side surface of the projection portion 8 (for example, the entire area of the side surface of the projection portion 8) facing the side surface of each of the vertical semiconductor devices 7 mounted on the upper surfaces of the mounting portions 6.

The abrasive layer 11 is configured such that abrasive grains having a particle diameter of, for example, #4000 or more are bonded on the surface thereof. The reason is that the vertical semiconductor devices 7 may be scratched when the abrasive grains having the large particle diameter are used. The abrasive layer 11 is formed in a sheet, so that a surface of the abrasive layer 11 facing the side surface of the each of the vertical semiconductor devices 7 is an inclined surface to the upper surfaces of the mounting portions 6.

The groove portions 10 accommodate a foreign matter removed from the vertical semiconductor devices 7, and the groove portions 10 are formed in the portion near the position in which the abrasive layer 11 is disposed on the stage 2. More specifically, the groove portions 10 are formed in a frame shape along the inner portion of the frame portion 3 having the lattice pattern in the mounting portions 6. The groove portions 10 are formed along the inner portion of the frame portion 3 having the lattice pattern in the mounting portions 6, which suppresses the foreign matter to enter between the vertical semiconductor devices 7 being mounted and the mounting portions 6, and thus a defect generated in the vertical semiconductor devices 7 can be reduced.

In addition to that as described above, the semiconductor testing jig 1 includes a first positioning portion 4 and second positioning portions 5. The first positioning portion 4 is formed in at least one corner of four corners in the stage 2. The second positioning portions 5 are through-holes and two of them are each formed in two sides facing each other in the stage 2. The first positioning portion 4 and the second positioning portions 5 are formed by machining on the stage 2.

The positions of the vertical semiconductor devices 7 with respect to the testing device (not shown) that measures (tests) electrical properties is determined by the use of the first positioning portion 4 and the second positioning portions 5. More specifically, the first positioning portion 4 and the second positioning portions 5 determine the position of a pad disposed on the vertical semiconductor devices 7 with respect to a contact probe or the like being electrically in contact with the vertical semiconductor devices 7 from the testing device side. The semiconductor testing jig 1 is a testing jig for measuring electrical properties, and the semiconductor testing jig 1 can also be used for transferring the vertical semiconductor devices 7.

Next, a procedure for using the semiconductor testing jig 1 according to the first preferred embodiment including a method for removing a foreign matter will be described. First, the vertical semiconductor devices 7 are disposed with the lower surface electrodes being the mounting surfaces of the vertical semiconductor devices 7 in contact with the mounting portions 6 of the stage 2. The vertical semiconductor device 7 is, for example, a semiconductor chip per se which is an individual piece separated from a semiconductor wafer.

The vertical semiconductor devices 7 are disposed on the mounting portions 6 so as to slide in such a manner of being guided by the inclined surface of the abrasive layer 11 disposed on the projection portion 8 of the frame portion 3. When the vertical semiconductor devices 7 are disposed on the mounting portions 6, ends of the vertical semiconductor devices 7 come in contact with the abrasive layer 11 and rub against it, which removes the foreign matter adhering to the ends and the portion near the ends of the vertical semiconductor devices 7.

Moreover, the foreign matter connected to a metal electrode film can be removed by contacting the abrasive layer 11. The contact with the abrasive layer 11 does not occur only when the vertical semiconductor devices 7 are disposed, and it also occurs when transfer of the vertical semiconductor devices 7 generates vibration or vibration is applied to the vertical semiconductor devices 7, and thus the foreign matter can be effectively removed.

Each of the vertical semiconductor devices 7 is disposed such that all of the vertical semiconductor devices 7 are disposed in the same direction. The semiconductor testing jig 1 in which the vertical semiconductor devices 7 are disposed is disposed on the testing device that measures electrical properties. When the semiconductor testing jig 1 is disposed on the testing device, the direction of the semiconductor testing jig 1 is ensured by the use of the first positioning portion 4. Subsequently, the positions of the individual vertical semiconductor devices 7 with respect to the testing device and thus the contact probe are determined by the use of the second positioning portions 5.

The second positioning portions 5 are through-holes and are configured to fit into projection portions on the testing device side, but this is not restrictive, and the number of the second positioning portions 5 is not limited to four. As described above, the sixteen vertical semiconductor devices 7 are collectively positioned in the semiconductor testing jig 1 according to the first preferred embodiment.

Next, a method for manufacturing the semiconductor testing jig 1 will be described. The frame portion 3 of a resin formed in an injection mold is fixed to the stage 2 with, for example, a screw portion provided in a part of the frame portion 3. FIGS. 1 and 2 do not show the screw portion, and the screw portion may be provided either in the frame or outside the frame of the frame portion 3. A fixing method with the screw portion facilitates an exchange of the frame portion 3 and enables the removal of the frame portion 3 to perform maintenance of the abrasive layer 11.

Moreover, if a malfunction occurs in either the frame portion 3 or the stage 2, one of them can be exchanged to reduce maintenance cost of the semiconductor testing jig 1, which is an advantage. As to the frame portion 3 and the stage 2, only the fixing method with the screw portion is shown, but this is not restrictive. A fixing method in which one of the frame portion 3 and the stage 2 is provided with a projection portion and the other is provided with a groove or a recessed portion to fit into each other may be used.

As described above, in the semiconductor testing jig 1 according to the first preferred embodiment, the semiconductor testing jig 1 includes the abrasive layer 11 disposed, on the frame portion 3, in a position facing each of the vertical semiconductor devices 7 disposed on the mounting portions 6, so that when the vertical semiconductor devices 7 are disposed on the mounting portions 6 of the semiconductor testing jig 1, the contact of the vertical semiconductor devices 7 with the abrasive layer 11 removes the foreign matter adhering to the vertical semiconductor devices 7. Thus, during a test, the foreign matter can be suppressed to adhere to the lower surface electrodes being the mounting surfaces of the vertical semiconductor devices 7.

The foreign matter is suppressed to adhere between the vertical semiconductor devices 7 and the mounting portions 6, so that in a case where the vertical semiconductor devices 7 are pressed hard against the mounting portions 6 during the test, a defect such as a crack is not generated in a contact portion of the vertical semiconductor devices 7 with the mounting portions 6 and in a portion near the contact portion. Thus, yields of the vertical semiconductor devices 7 can improve.

Furthermore, upon the test of the vertical semiconductor devices 7, each of the vertical semiconductor devices 7 is disposed on the mounting portions 6 of the semiconductor testing jig 1, so that disposing the abrasive layer 11 on the semiconductor testing jig 1 eliminates the need for each of the vertical semiconductor devices 7 to take measures against the foreign matter. Thus, the manufacturing process of the vertical semiconductor devices 7 can be simplified and the manufacturing costs can be reduced.

In addition, in the semiconductor testing jig 1, the plurality of vertical semiconductor devices 7 are collectively positioned on the stage 2, so that the testing time can be shorten and the testing process can be simplified.

The frame portion 3 includes the projection portion 8, the abrasive layer 11 is disposed on the side surface of the projection portion 8 facing the side surface of each of the vertical semiconductor devices 7 mounted on the upper surfaces of the mounting portions 6, and the side surface of the projection portion 8 on which the abrasive layer 11 is disposed is the inclined surface to the upper surfaces of the mounting portions 6. Therefore, when the vertical semiconductor devices 7 are disposed on the mounting portions 6, the ends of the vertical semiconductor devices 7 come in contact with the abrasive layer 11 and rub against it, which can remove the foreign matter adhering to the ends and the portion near the ends of the vertical semiconductor devices 7.

The vertical semiconductor devices 7 are disposed on the mounting portions 6 so as to slide in such a manner of being guided by the inclined surface of the abrasive layer 11, so that the vertical semiconductor devices 7 are easily disposed.

The abrasive layer 11 is configured such that the abrasive grains are fixed on the surface thereof, so that the foreign matter adhering to the vertical semiconductor devices 7 are easily caught, and subsequently the foreign matter is easily peeled off.

The abrasive layer 11 on the projection portion 8 of the frame portion 3 may be formed such that a sand paper or an abrasive cloth adheres to the inclined surface facing the side surface of each of the vertical semiconductor devices 7. When the adhesive layer 11 is configured using the sand paper, the adhesive layer 11 is easily exchanged. On the other hand, when the abrasive layer 11 is configured using the adhesive cloth, the adhesive layer 11 is easily exchanged. A flexible cloth is a base material for the adhesive cloth, which hardly scratches the vertical semiconductor devices 7, and thus breakage of the vertical semiconductor devices 7 can be suppressed.

Moreover, the abrasive layer 11 may be formed to include an uneven worked surface formed on the frame portion 3. In a case where the frame portion 3 is formed in the injection mold, the uneven worked surface can be formed simultaneously, and thus the manufacturing costs can be reduced.

The semiconductor testing jig 1 further includes the groove portions 10 formed in the portion near the position on which the abrasive layer 11 is disposed in the stage 2, and thus the groove portions 10 can accommodate a foreign matter (for example, Si chip) mainly generated from an end face of the vertical semiconductor devices 7. This can suppress the movement and the spread of the foreign matter to the lower surface electrodes of the vertical semiconductor devices 7.

First Modification of First Preferred Embodiment

Figure 3:
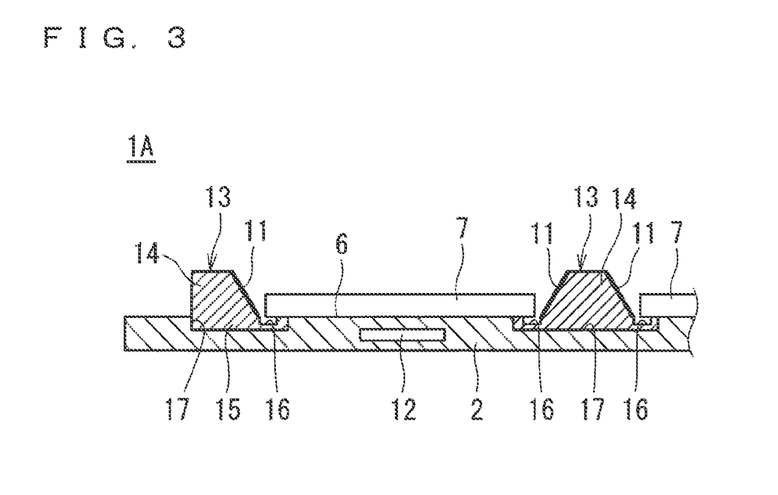
FIG. 3 is a cross sectional view of a semiconductor testing jig according to a first modification of the first preferred embodiment.

Next, a semiconductor testing jig 1A according to a first modification of the first preferred embodiment will be described. FIG. 3 is a cross sectional view of the semiconductor testing jig 1A according to the first modification of the first preferred embodiment. FIG. 3 shows an example of the semiconductor testing jig 1A according to the first modification of the first preferred embodiment in which the structures of the frame portion and the groove portions of the semiconductor testing jig 1 are changed and a vibration mechanism 12 is added.

A frame portion 13 includes a frame body 14 and a base portion 15. The frame body 14 is formed of a projection portion. The base portion 15 is disposed on a proximal side of the frame body 14. The base portion 15 includes a horizontal portion extending horizontally, and the base portion 15 has a width larger than a width of the frame body 14. In the stage 2, a recessed portion 17 is formed from the end of the mounting portions 6 to an outer periphery. The base portion 15 is disposed on the recessed portion 17 formed in the stage 2.

The horizontal portion of the base portion 15 is formed so as to protrude from the proximal side of the inclined surface of the frame body 14 to the end side of the mounting portions 6, and an upper surface of the horizontal portion of the base portion 15 is in contact with the end of the lower surface of the vertical semiconductor devices 7 disposed on the mounting portions 6. The base portion 15 increases a contact area between the stage 2 and the frame portion 13 to increase stability for mounting the frame portion 13. The base portion 15 increases a creepage distance between the lower surface electrodes of the vertical semiconductor devices 7 adjacent to each other to suppress electrical discharge generated during the test.

Groove portions 16 are formed in a portion near the position in which the abrasive layer 11 is disposed on the base portion 15. More specifically, the groove portions 16 are formed in the horizontal portion of the base portion 15, and the groove portions 16 also extend to the inclined surface of the frame body 14. Thus, the foreign matter removed from the vertical semiconductor devices 7 goes down along the inclined surface of the abrasive layer 11 to be accommodated in the groove portions 16.

Moreover, the vibration mechanism 12 is disposed inside of the stage 2. The vibration mechanism 12 applies vibration to the vertical semiconductor devices 7 to accelerate removal of the foreign matter from the vertical semiconductor devices 7.

While the vertical semiconductor devices 7 are mounted and the semiconductor testing jig 1 is transferred, the contact between the vertical semiconductor devices 7 and the abrasive layer 11 may not sufficiently remove the foreign matter. Thus, vibration is intensively applied to the vertical semiconductor devices 7, which allows for an acceleration of the contact between the vertical semiconductor devices 7 and the abrasive layer 11.

The vibration mechanism 12 is disposed in the stage 2 on the lower surface side of the vertical semiconductor devices 7, but this is not restrictive, and the vibration mechanism 12 may be disposed in the frame portion 13. While the vertical semiconductor devices 7 are mounted, the semiconductor testing jig 1 is transferred, or before and after the test, the vibration mechanism 12 applies vibration to the vertical semiconductor devices 7 to remove a foreign matter from the vertical semiconductor devices 7 before the next process, to thereby suppress the foreign matter brought in the next process. The vibration mechanism 12 is configured using piezoelectric elements, for example. The reason is that using the piezoelectric elements can easily generate the desirable vibration electrically. In addition, a configuration to generate vibration using an eccentric motor may be used.

As described above, in the semiconductor testing jig 1A according to the first modification of the first preferred embodiment, the frame portion 13 includes the frame body 14 formed of the projection portion and the base portion 15 disposed on the proximal side of the frame body 14, and the recessed portion 17 on which the base portion 15 is disposed is formed in the stage 2. Thus, the creepage distance between the lower surface electrodes of the vertical semiconductor devices 7 adjacent to each other increases by the width of the horizontal portion of the base portion 15, so that the electrical discharge generated between the lower surface electrodes can be suppressed, and thus measurement accuracy can be improved.

The base portion 15 having the width larger than the width of the frame body 14 is disposed on the recessed portion 17 in the stage 2, and thus the contact area between the stage 2 and the frame portion 13 can be increased, which allows for an increase in the stability for mounting the frame portion 13 on the stage 2. Thus, a change in the shape of the base portion 15, such as deformation and detachment, is suppressed in a test under high temperatures and under low temperatures, whereby the vertical semiconductor devices 7 can be held stably.

The semiconductor testing jig 1A further includes the groove portions 16 formed in the portion near the position in which the abrasive layer 11 is disposed on the base portion 15, and thus the groove portions 16 can accommodate a foreign matter (for example, Si chip) mainly generated from the end face of the vertical semiconductor devices 7. This can suppress the movement and the spread of the foreign matter to the lower surface electrodes of the vertical semiconductor devices 7.

The semiconductor testing jig 1A further includes the vibration mechanism 12 that is disposed in the frame portion 13 or the stage 2 and applies vibration to the vertical semiconductor devices 7. Moreover, the method for removing a foreign matter with the semiconductor testing jig 1A includes the steps of applying vibration to the vertical semiconductor devices 7 using the vibration mechanism 12. Therefore, the frame portion 13 or the stage 2 applies vibration to the vertical semiconductor devices 7, which allows for an acceleration of the contact between the vertical semiconductor devices 7 and the abrasive layer 11, and thus the removal of the foreign matter from the vertical semiconductor devices 7 can be accelerated. Furthermore, the vibration mechanism 12 is configured using the piezoelectric elements, which allows for miniaturization of the vibration mechanism 12.

Second Modification of First Preferred Embodiment

Figure 4:
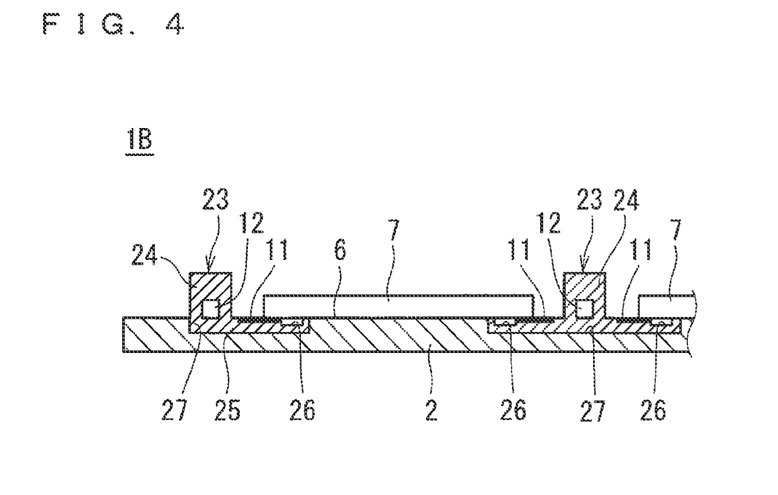
FIG. 4 is a cross sectional view of a semiconductor testing jig according to a second modification of the first preferred embodiment.

Next, a semiconductor testing jig 1B according to a second modification of the first preferred embodiment will be described. FIG. 4 is a cross sectional view of the semiconductor testing jig 1B according to the second modification of the first preferred embodiment. FIG. 4 shows an example of the semiconductor testing jig 1B according to the second modification of the first preferred embodiment in which the structures of the frame portion and the groove portions of the semiconductor testing jig 1 are changed and the vibration mechanism 12 is added.

A frame portion 23 includes a frame body 24 and a base portion 25. The frame body 24 is formed of a projection portion and formed in a rectangle in a cross sectional view, and a side surface of the frame body 24 is a vertical plane. The vibration mechanism 12 is disposed inside of the frame body 24. The vibration mechanism 12 may be disposed inside the stage 2 on the lower surface side of the vertical semiconductor devices 7.

The base portion 25 is disposed on a proximal side of the frame body 24. The base portion 25 includes a horizontal portion extending horizontally, and the base portion 25 has a width larger than a width of the frame body 24. In the stage 2, a recessed portion 27 is formed from the end of the mounting portions 6 to an outer periphery. The base portion 25 is disposed on the recessed portion 27 formed in the stage 2.

The horizontal portion of the base portion 25 is formed so as to protrude from the proximal side of the vertical plane of the frame body 24 to the end side of the mounting portions 6, and an upper surface of the horizontal portion of the base portion 25 is in contact with the end of the lower surface of the vertical semiconductor devices 7 disposed on the mounting portions 6. The base portion 25 increases a contact area between the stage 2 and the frame portion 23 to increase stability for mounting the frame portion 23. The base portion 25 increases a creepage distance between the lower surface electrodes of the vertical semiconductor devices 7 adjacent to each other to suppress electrical discharge generated during the test. The width of the horizontal portion of the base portion 25 is formed to have a dimension larger than the case in FIG. 3, so that the abrasive layer 11 and groove portions 16 can be disposed.

The groove portion 26 is formed in a tip of the horizontal portion of the base portion 25. In other words, the groove portion 26 is formed in the horizontal portion on the end side of the mounting portions 6. The abrasive layer 11 is disposed closer to the proximal side than the groove portion 26 in the horizontal portion of the base portion 25. The abrasive layer 11 is disposed on the upper surface of the horizontal portion of the base portion 25 facing the lower surface of each of the vertical semiconductor devices 7 disposed on the mounting portions 6. The upper surface of the horizontal portion of the base portion 25 is parallel to the upper surfaces of the mounting portions 6. More specifically, the upper surface of the horizontal portion of the base portion 25 is on a level with the upper surfaces of the mounting portions 6.

In this manner, the groove portions 26 are disposed between the abrasive layer 11 and the mounting portions 6, to thereby prevent the foreign matter, which are removed, from adhering between the vertical semiconductor devices 7 being disposed and the mounting portions 6.

As described above, in the semiconductor testing jig 1B according to the second modification of the first preferred embodiment, the frame portion 23 includes the horizontal portion of the base portion 25, the abrasive layer 11 is disposed on the upper surface of the base portion 25 facing the lower surface of each of the vertical semiconductor devices 7 disposed on the upper surfaces of the mounting portions 6, and the upper surface of the horizontal portion of the base portion 25 on which the abrasive layer 11 is disposed is a parallel surface to the upper surfaces of the mounting portions 6. Thus, the creepage distance between the lower surface electrodes of the vertical semiconductor devices 7 adjacent to each other increases by the width of the horizontal portion of the base portion 25, so that the electrical discharge generated between the lower surface electrodes can be suppressed, and thus measurement accuracy can be improved.

Moreover, the base portion 25 having the width larger than the width of the frame body 24 is disposed on the recessed portion 27 in the stage 2, and thus the contact area between the stage 2 and the frame portion 23 can be increased, which allows for an increase in the stability for mounting the frame portion 23 on the stage 2. Thus, a change in the shape of the base portion 25, such as deformation and detachment, is suppressed in testing under high temperatures and under low temperatures, whereby the vertical semiconductor devices 7 can be held stably. Furthermore, the contact area between the stage 2 and the frame portion 23 is increased more than the case in FIG. 3, and thus the foreign matter connected to the metal electrode film can be removed with more reliability.

The upper surfaces of the mounting portions 6 are on a level with the upper surface of the horizontal portion of the base portion 25 on which the abrasive layer 11 is disposed, so that a gap between the mounting portions 6 and the vertical semiconductor devices 7 is suppressed, whereby the contact between the mounting portions 6 and the vertical semiconductor devices 7 can be secured.

A movement mechanism that vertically moves a portion including the horizontal portion of the base portion 25 on which the abrasive layer 11 is disposed may be disposed on the semiconductor testing jig 1B. The movement mechanism can be achieved by disposing a spring mechanism between the recessed portion 27 and the base portion 25, for example, but this is not restrictive. In a case where the movement mechanism is disposed, the height of the upper surfaces of the mounting portions 6 is made identical to the height of the upper surface of the horizontal portion of the base portion 25, whereby the contact between the mounting portions 6 and the vertical semiconductor devices 7 can be secured. Upon a test, the portion including the upper surface of the horizontal portion of the base portion 25 is moved down such that the height of the upper surface of the abrasive layer 11 is lower than the height of the upper surfaces of the mounting portions 6. Thus, upon the test, the end of the vertical semiconductor devices 7 is not in contact with the abrasive layer 11, which can suppress a breakage of the vertical semiconductor devices 7.

Second Preferred Embodiment

Figure 5:
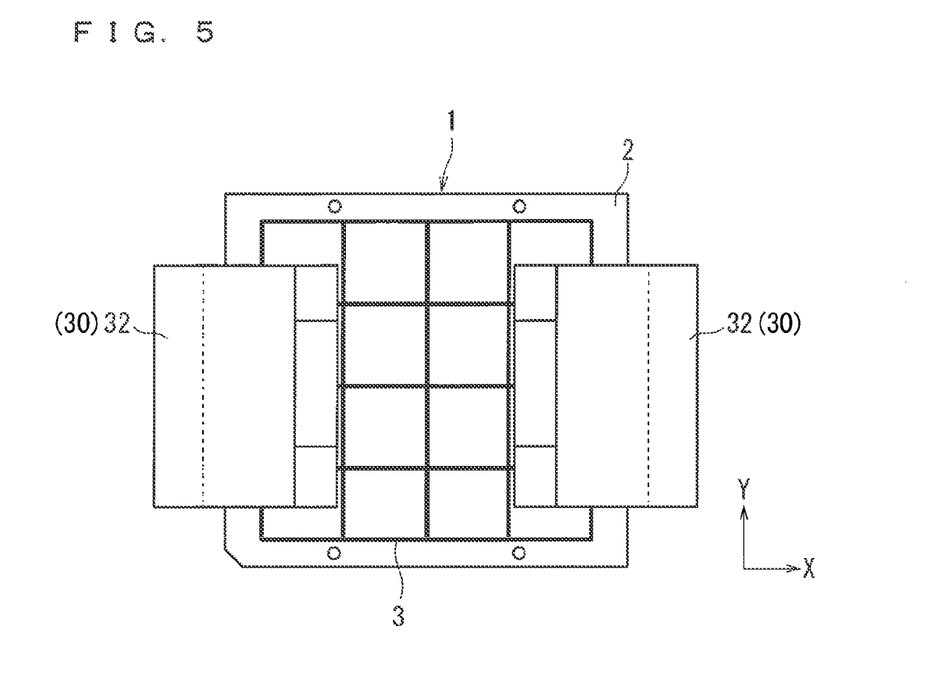
FIG. 5 is a plan view of a transfer jig and a semiconductor testing jig supported by the transfer jig according to a second preferred embodiment.
Figure 6:
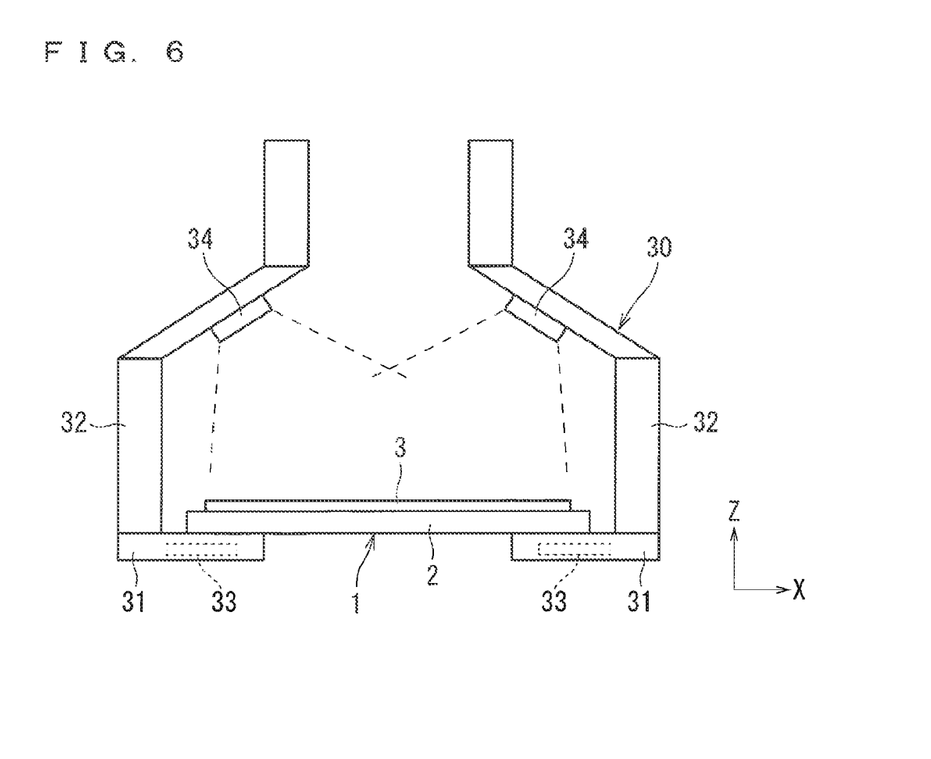
FIG. 6 is a side view of the transfer jig and the semiconductor testing jig supported by the transfer jig according to the second preferred embodiment.

Next, a transfer jig 30 of a semiconductor testing jig according to a second preferred embodiment will be described. FIG. 5 is a plan view of the transfer jig 30 and the semiconductor testing jig 1 supported by the transfer jig 30 according to the second preferred embodiment. FIG. 6 is a side view of the transfer jig 30 and the semiconductor testing jig 1 supported by the transfer jig 30 according to the second preferred embodiment. In the second preferred embodiment, the same components as those described in the first preferred embodiment are denoted by the same references, which are not described here.

The transfer jig 30 is used to transfer a semiconductor testing jig. The transfer jig 30 transfers the vertical semiconductor devices 7 disposed on the semiconductor testing jig to a testing device (not shown). In the second preferred embodiment, the case of transferring the semiconductor testing jig 1 will be described, and the other semiconductor testing jigs (for example, the semiconductor testing jigs 1A and 1B) can also be transferred.

As shown in FIGS. 5 and 6, the transfer jig 30 supports the semiconductor testing jig 1 from both sides (X direction side and −X direction side) and transfers it in a suspended state. The transfer jig 30 includes a pair of supporting portions 31 that support the both sides (X direction side and −X direction side) of the semiconductor testing jig 1 and a pair of suspension portions 32 that suspend each supporting portion 31.

Vibration mechanisms 33 are disposed in a portion near a contact portion of the transfer jig 30 with the semiconductor testing jig 1, namely, the inside of the supporting portions 31. The vibration mechanisms 33 apply vibration to the semiconductor testing jig 1 and thus to the vertical semiconductor devices 7 in order to accelerate removal of a foreign matter from the vertical semiconductor devices 7. The vibration mechanism 33 has the same structure as that of the vibration mechanism 12, and description in detail will be omitted.

The suspension portions 32 are formed so as to extend upward from outer ends of the supporting portions 31 and bent inward in a midsection. Charge eliminators 34 are disposed in the bent portions of the suspension portions 32. In other words, the charge eliminators 34 are disposed in positions facing the upper surfaces of the vertical semiconductor devices 7 supported by the supporting portions 31. The charge eliminators 34 are configured using, for example, an ionizer. Some foreign matters are strongly adhered because they are electrically charged, but the charge eliminators 34 eliminate static charge from the vertical semiconductor devices 7, which allows for easy removal of the foreign matter being electrically charged. The charge eliminators 34 may have a configuration employing humidity or heat.

As described above, the transfer jig 30 of the semiconductor testing jig according to the second preferred embodiment includes the vibration mechanism 33 that is disposed in the portion near the contact portion with the semiconductor testing jig 1 and applies vibration to the vertical semiconductor devices 7. A plurality of semiconductor testing jigs need to be prepared according to the size of the vertical semiconductor devices 7, but the transfer jig 30 can transfer a variety of semiconductor testing jigs, so that the transfer jig 30 prepared for testing may be less than the number of semiconductor testing jigs in general. Therefore, costs for semiconductor testing can be reduced more than the case where vibration mechanisms are disposed in individual semiconductor testing jigs.

Moreover, the method for removing a foreign matter with the transfer jig 30 for the semiconductor testing jig includes the step of applying vibration to the vertical semiconductor devices 7 using the vibration mechanism 33, and the vibration is applied to the vertical semiconductor devices 7 from the transfer jig 30 through the semiconductor testing jig 1, which allows for an acceleration of the contact between the vertical semiconductor devices 7 and the abrasive layer 11, whereby the removal of the foreign matter from the vertical semiconductor devices 7 can be accelerated.

The transfer jig 30 includes the charge eliminators 34 that eliminate static charge from the foreign matter adhering to the semiconductor vertical devices 7, and the static charge is eliminated beforehand from the foreign matter being electrically charged, whereby the foreign matter being electrically charged can be easily eliminated from the vertical semiconductor devices 7 and easily peeled off from the abrasive layer 11. Furthermore, the charge eliminators 34 are configured using the ionizer, and thus the static charge can be easily eliminated.

Modification of Second Preferred Embodiment

Figure 7:
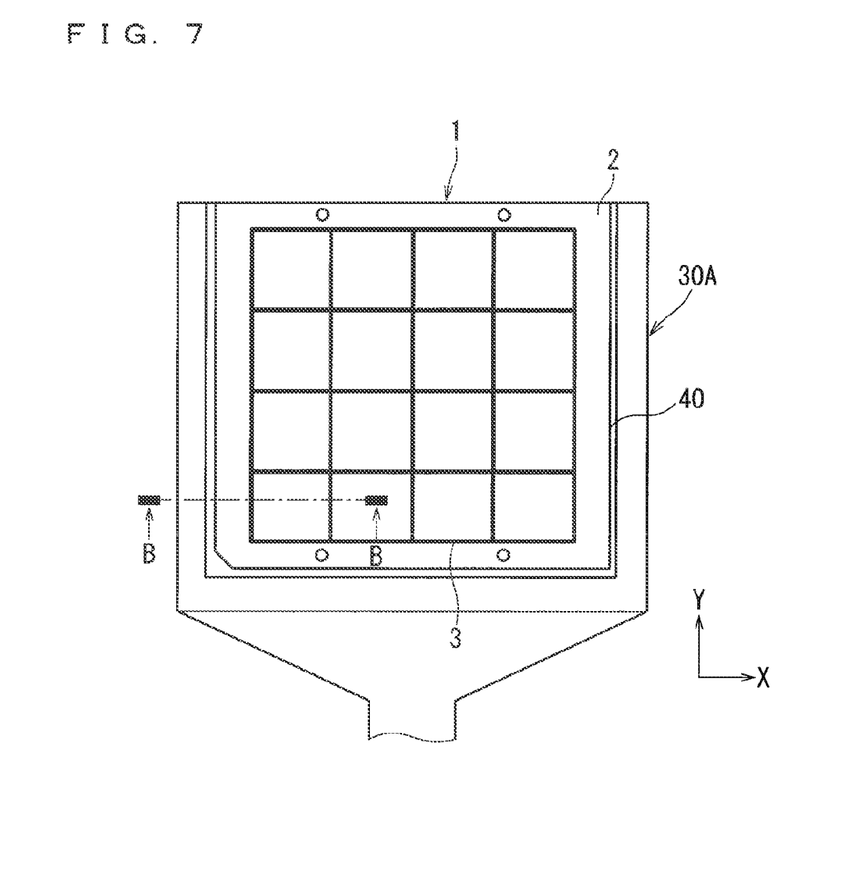
FIG. 7 is a plan view of a transfer jig and a semiconductor testing jig supported by the transfer jig according to a modification of the second preferred embodiment.
Figure 8:
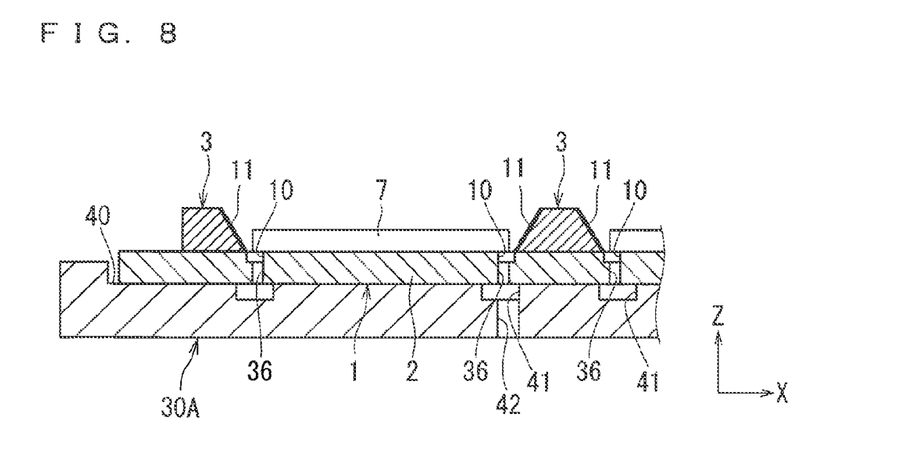
FIG. 8 is a cross sectional view of the transfer jig and the semiconductor testing jig supported by the transfer jig according to the modification of the second preferred embodiment.

Next, a transfer jig 30A of the semiconductor testing jig according to a modification of the second preferred embodiment will be described. FIG. 7 is a plan view of the transfer jig 30A and the semiconductor testing jig 1 supported by the transfer jig 30A according to the modification of the second preferred embodiment. FIG. 8 is a cross sectional view of the transfer jig 30A and the semiconductor testing jig 1 supported by the transfer jig 30A according to the modification of the second preferred embodiment, and more specifically, it is a cross sectional view taken along a B-B line in FIG. 7. In the modification of the second preferred embodiment, the case of transferring the semiconductor testing jig 1 will be described, and the other semiconductor testing jigs (for example, the semiconductor testing jigs 1A and 1B) can also be transferred.

As shown in FIGS. 7 and 8, the transfer jig 30A transfers in a state in which the transfer jig 30A supports the lower side of the semiconductor testing jig 1. The transfer jig 30A is formed in a rectangle in plan view, and the transfer jig 30A includes a counterbore portion 40, intake grooves 41, and an intake opening 42. The counterbore portion 40 for disposing the semiconductor testing jig 1 is formed on the upper surface of the transfer jig 30A.

The semiconductor testing jig 1 disposed in the counterbore portion 40 of the transfer jig 30A is denoted by the same references as the semiconductor testing jig 1 according to the first preferred embodiment, and the structures slightly vary from each other. More specifically, discharge holes 36 communicating with the groove portions 10 are formed in the semiconductor testing jig 1 disposed in the counterbore portion 40.

The intake grooves 41 are formed in positions communicating with the discharge holes 36 in the counterbore portion 40 in a state in which the semiconductor testing jig 1 is disposed in the counterbore portion 40. The intake opening 42 is formed in some of the plurality of intake grooves 41. The intake opening 42 is connected to an intake means (not shown) disposed outside the transfer jig 30A. The foreign matter removed from the vertical semiconductor devices 7 is accommodated in the groove portions 10 of the semiconductor testing jig 1, and the foreign matter accommodated in the groove portions 10 of the semiconductor testing jig 1 can be discharged outside through the discharge holes 36, the intake grooves 41, and the intake opening 42. When the intake opening 42 is not formed in the intake grooves 41, the foreign matter accommodated in the groove portions 10 of the semiconductor testing jig 1 is accommodated in the intake grooves 41 through the discharge holes 36.

The intake means is, for example, a rotating fan, but this not restrictive. For example, a space, defined by the frame portion 3, on which the vertical semiconductor devices 7 are disposed, is a closed region, and air in the space may be evacuated. Moreover, the foreign matter is preferably removed after the application of vibration during a transfer. Thus, before evaluations of the testing device, the foreign matter can be effectively removed. In addition, the vibration mechanism may be disposed in the portion near the contact portion of the transfer jig 30A with the semiconductor testing jig 1, namely, inside the transfer jig 30A below the vertical semiconductor devices 7.

As described above, in the modification of the second preferred embodiment, the semiconductor testing jig 1 further includes the discharge holes 36 communicating with the groove portions 10, so that the foreign matter removed from the vertical semiconductor devices 7 can be effectively discharged through the discharge holes 36. Thus, the foreign matter removed from the vertical semiconductor devices 7 can be suppressed to adhere to the vertical semiconductor devices 7 again.

The transfer jig 30A includes the intake grooves 41 communicating with the discharge holes 36 of the semiconductor testing jig 1, so that the foreign matter removed from the vertical semiconductor devices 7 can be effectively discharged outside through the intake grooves 41.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor testing jig for testing a plurality of vertical semiconductor devices each having a lower surface electrode and an upper surface electrode, said semiconductor testing jig comprising:
   a conductive stage including a plurality of mounting portions on which said plurality of vertical semiconductor devices are each individually disposed with said lower surface electrodes being in contact with said plurality of mounting portions;
   an insulating frame portion having a lattice pattern that is disposed on said stage and surrounds each of said plurality of mounting portions in plan view to define each of said mounting portions; and
   an abrasive layer disposed in a position in said frame portion, said position facing each of said vertical semiconductor devices disposed on said mounting portions.

2. The semiconductor testing jig according to claim 1, wherein
   said frame portion includes a projection portion, and
   said abrasive layer is disposed on a side surface of said projection portion that faces a side surface of each of said vertical semiconductor devices disposed on upper surfaces of said mounting portions, said side surface of said projection portion on which said abrasive layer is disposed being an inclined surface to said upper surfaces of said mounting portions.

3. The semiconductor testing jig according to claim 1, wherein
   said frame portion includes a horizontal portion, and
   said abrasive layer is disposed on an upper surface of said horizontal portion that faces a lower surface of each of said vertical semiconductor devices disposed on upper surfaces of said mounting portions, said upper surface of said horizontal portion on which said abrasive layer is disposed being a parallel surface to said upper surfaces of said mounting portions.

4. The semiconductor testing jig according to claim 3, wherein said upper surfaces of said mounting portions are on a level with said upper surface of said horizontal portion on which said abrasive layer is disposed.

5. The semiconductor testing jig according to claim 3, further comprising a movement mechanism that vertically moves a portion including said upper surface of said horizontal portion on which said abrasive layer is disposed.

6. The semiconductor testing jig according to claim 1, wherein said abrasive layer is configured such that an abrasive grain is bonded on a surface thereof.

7. The semiconductor testing jig according to claim 1, wherein said abrasive layer is configured using a sand paper.

8. The semiconductor testing jig according to claim 1, wherein said abrasive layer is configured using an abrasive cloth.

9. The semiconductor testing jig according to claim 1, wherein said abrasive layer includes an uneven worked surface formed on said frame portion.

10. The semiconductor testing jig according to claim 1, further comprising a groove portion formed in a portion near a position in which said abrasive layer is disposed in said stage.

11. The semiconductor testing jig according to claim 1, wherein
   said frame portion includes a frame body formed of a projection portion, and a base portion disposed on a proximal side of said frame body, said base portion having a width larger than a width of said frame body, and a recessed portion on which said base portion is disposed is formed in said stage.

12. The semiconductor testing jig according to claim 11, further comprising a groove portion formed in a portion near a position in which said abrasive layer is disposed on said base portion.

13. The semiconductor testing jig according to claim 10, further comprising a discharge hole communicating with said groove portion.

14. The semiconductor testing jig according to claim 1, further comprising a vibration mechanism that is disposed in said frame portion or said stage and applies vibration to said vertical semiconductor devices.

15. The semiconductor testing jig according to claim 14, said vibration mechanism is configured using a piezoelectric element.

16. A transfer jig for a semiconductor testing jig for transferring said semiconductor testing jig according to claim 1, comprising a vibration mechanism that is disposed in a portion near a contact portion with said semiconductor testing jig and applies vibration to said vertical semiconductor devices.

17. A transfer jig for a semiconductor testing jig for transferring said semiconductor testing jig according to claim 13, comprising an intake groove communicating with said discharge hole.

18. A transfer jig for a semiconductor testing jig for transferring said semiconductor testing jig according to claim 1, comprising a charge eliminator that eliminates static charge from a foreign matter adhering to said vertical semiconductor devices.

19. The transfer jig for the semiconductor testing jig according to claim 18, wherein said charge eliminator is configured using an ionizer.

* * * * *